United States Patent
Kim et al.

(10) Patent No.: US 6,530,652 B1
(45) Date of Patent: Mar. 11, 2003

(54) MICRO ACTUATOR AND INK JET PRINTER HEAD MANUFACTURED USING THE SAME

(75) Inventors: Il Kim, Kyungki-Do (KR); Young Jin Cho, Kyungki-Do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/336,333

(22) Filed: Jun. 18, 1999

(30) Foreign Application Priority Data

Dec. 30, 1998 (KR) .......................................... 98-60640

(51) Int. Cl.[7] ................................................ B41J 2/045
(52) U.S. Cl. .......................................... 347/70; 347/71
(58) Field of Search .............................. 347/68, 70, 71, 347/15, 48

(56) References Cited

U.S. PATENT DOCUMENTS 5,831,651 A * 11/1998 Usui et al. .................... 347/70
6,145,966 A * 11/2000 Hotomi et al. ................ 347/70
6,213,594 B1 * 4/2001 Kitahara ....................... 347/70

FOREIGN PATENT DOCUMENTS

JP 58-190861 A * 10/1984
JP 10-128971     5/1998

OTHER PUBLICATIONS

English Translation of Abstract of Japanese Application No. 10–128971 dated May 19, 1998.

* cited by examiner

Primary Examiner—Judy Nguyen
(74) Attorney, Agent, or Firm—Staas & Halsey LLP

(57) ABSTRACT

Disclosed is a micro actuator and an ink jet printer head manufactured using the same. The micro actuator comprises a substrate having a space part which is integrally defined in the substrate and is opened only at a lower end thereof; a first piezoelectric element formed on the substrate in a first area which is arranged above the space part and actuated when voltage is applied thereto; a second piezoelectric element formed on the substrate in a second area which is not arranged above the space part and not actuated even when voltage is applied thereto; and an upper electrode formed on the first piezoelectric element; whereby rigidity of an entire structure is elevated and panel vibration is reduced, by the second piezoelectric element.

24 Claims, 7 Drawing Sheets

MICRO ACTUATOR AND INK JET PRINTER HEAD MANUFACTURED USING THE SAME

BACKGROUND OF THE INVENTION

1. Field of the Invention

The present invention relates to a micro actuator and an ink jet printer head fabricated using the same, and more particularly, the present invention relates to a micro actuator which is manufactured by patterning a piezoelectric element employing an etching technique and to an ink jet printer head which is fabricated using the micro actuator.

2. Description of the Related Art

Generally, a micro actuator includes a lower structure which has a vibrating plate and a chamber, a piezoelectric element which is coupled onto a substrate and is mechanically deformed when electric power is applied thereto, and an electrodes) which transfers electric power to the piezoelectric element.

Referring to FIG. 1, there is shown a cross-sectional view illustrating an example of a micro actuator according to the related art. In the micro actuator as shown in FIG. 1, electric power is supplied to electrode 118 and electrode 114, which is formed on a diaphragm 111 formed over substrate 110, and electrode 118, a piezoelectric element 116 vibrates while repeating deformation and return.

In order to manufacture a micro actuator, methods as described below have been used.

In a first method, a lower electrode is formed on a substrate which is patterned into a thin and precise size and then, is baked at a temperature of no less than 1200° C. Then, piezoelectric element paste is formed on the lower electrode by a screen printing method and baked at a high temperature of no less than 1000° C. Thereafter, an upper electrode is formed on the piezoelectric element and baked at a temperature of about 800° C., whereby the micro actuator is manufactured.

In the case that a thin film or a thick film of a piezoelectric element is directly formed on a substrate, the substrate is likely to be deformed due to a high sintering temperature of the piezoelectric element. Accordingly, ceramic which is capable of enduring the sintering temperature of the piezoelectric element, is used as the substrate, and zirconia is widely used among various ceramic materials.

Also, when the screen printing method is used, a problem is caused in that it is difficult to precisely pattern the piezoelectric element paste to a desired fine pattern.

In a second method for manufacturing a micro actuator, a piezoelectric element which is separately formed or manufactured is bonded to a metal substrate by a third material and then, the prepared piezoelectric element plate is machined to have a predetermined size thereby to construct actuators of a desired number. Alternatively, in the second method, a piezoelectric element which is machined to a size which is suitable for one actuator, is bonded onto a metal substrate to construct an actuator.

In this method, since metal is used as the substrate, an advantage is provided in that a process of high precision such as fine machining of ceramic can be avoided.

However, in the case of machining the piezoelectric element plate in order to obtain a desired number of actuators, integration density cannot but be decreased due to a limit in machining, whereby precision and reliability of end products are reduced and it is difficult to achieve competitiveness in quality and productivity.

In addition, in the case that the piezoelectric element which is machined to a predetermined size is bonded onto the metal substrate, since yield rate is reduced for respective actuators, it is difficult to simultaneously manufacture a plurality of actuators.

In order to solve the problems encountered in the related art, in Korean Patent Application No. 98-29816 which was filed by the applicant of the present application, there is disclosed a method for manufacturing a micro actuator, in which a piezoelectric element having a predetermined thickness is attached onto a substrate and then is etched, thereby to form a plurality of piezoelectric elements having a desired thickness.

In this method, when manufacturing the micro actuator, a remaining portion of the piezoelectric element, except for a portion which is integrated with the substrate and used in driving a cell, is wholly removed by etching.

When manufacturing the micro actuator using the above method, advantages are provided in that the problems encountered in the related art can be resolved.

However, the method for manufacturing the micro actuator suffers from defects in that since an amount of the piezoelectric element which is removed by the etching process is fairly large, etching solution is wasted and rapidly degraded. Moreover, the etching solution can impose harmful influences on the substrate.

While the aforementioned micro actuator can be used to manufacture various articles, an ink jet printer head can be exemplified as a typical example which can be manufactured using the micro actuator.

FIG. 2 is a cross-sectional view illustrating an example of an ink jet printer head according to the related art.

As can be readily seen from FIG. 2, an ink jet printer head includes a nozzle plate 222 which is formed with a nozzle 220, a reservoir plate 226 which is formed with a reservoir 224, a fluid passage plate 230 which is formed with a fluid passage 228, a restrictor plate 234 which is formed with a restrictor 232, a chamber plate 210 which defines a chamber 212, an actuator comprising an upper electrode 218, a piezoelectric element 216 and a lower electrode 214, which is formed on a substrate 211. The nozzle plate 222, the reservoir plate 226, the fluid passage plate 230, the restrictor plate 234, the chamber plate 210 and the actuator are sequentially stacked one upon another from bottom to top.

By the construction described above, ink moving paths such as the nozzle 220, the reservoir 234, the fluid passage 228, the restrictor 232 and the chamber 212, which have different sizes and configurations, are defined in the ink jet printer head.

Ink supplied from an ink container (not shown) is stored in the reservoir 224 and is supplied to the chamber 212 through the fluid passage 228. At this time, the restrictor 232 formed between the fluid passage 228 and the chamber 212 serves to keep velocity of ink flowing into the chamber 212 constant.

If voltage is applied to the upper electrode 218 and the lower electrode 214 of the micro actuator which is formed above the chamber 212, the piezoelectric element 216 is actuated, and by this actuation of the piezoelectric element 216, as volume of the chamber 212 is momentarily reduced, ink stored in the chamber 212 is injected through the nozzle.

Due to the fact that the ink jet printer head uses the micro actuator manufactured as described above in order to inject ink, the ink jet printer head also suffers from the same defects as described above with respect to the micro actuator.

SUMMARY OF THE INVENTION

Accordingly, the present invention has been made in an effort to solve the problems occurring in the related art, and an object of the present invention is to provide a micro actuator wherein a remaining portion of a piezoelectric element, except for a portion which is integrated with a substrate and used in driving a cell, is not wholly removed, and instead, only a boundary portion between a first piezoelectric element portion which is arranged above a space part and is actuated when voltage is applied thereto and a second piezoelectric element portion which is not arranged above the space part and is not actuated when voltage is applied thereto, is etched, thereby accomplishing economy and improving repeatability of processing.

Another object of the present invention is to provide an ink jet printer head which is manufactured using the micro actuator.

In order to achieve the above objects, according to one aspect of the present invention, there is provided a micro actuator comprising: a substrate having a space part which is integrally defined in the substrate and is opened only at a lower end thereof; a first piezoelectric element formed on the substrate in a first area which is arranged above the space part and actuated when voltage is applied thereto; a second piezoelectric element formed on the substrate in a second area which is not arranged above the space part and not actuated even when voltage is applied thereto; and an upper electrode formed on the first piezoelectric element; whereby rigidity of an entire structure is elevated and panel vibration is reduced, by the second piezoelectric element.

According to another aspect of the present invention, there is provided an ink jet printer head comprising: a substrate having a space part which is integrally defined in the substrate and is opened only at a lower end thereof; a nozzle plate formed under the substrate; a nozzle formed in the nozzle plate for injecting ink to record information; a chamber formed by the space part and the nozzle plate and containing ink; a first piezoelectric element formed on the substrate in a first area which is arranged above the space part and actuated when voltage is applied thereto; a second piezoelectric element formed on the substrate in a second area which is not arranged above the space part and not actuated even when voltage is applied thereto; and an upper electrode formed on the first piezoelectric element; whereby rigidity of an entire structure is elevated and panel vibration is reduced, by the second piezoelectric element.

According to still another aspect of the present invention, there is provided an ink jet printer head comprising: a substrate having a space part which is integrally defined in the substrate and is opened only at a lower end thereof; a restrictor plate formed under the substrate; a chamber formed by the space part of the substrate and the restrictor plate; a restrictor formed by the restrictor plate for keeping velocity of ink flowing into the chamber constant; a fluid passage plate formed under the restrictor plate; a fluid passage formed by the fluid passage plate for defining an ink flowing path; a reservoir plate formed under the fluid passage plate; a reservoir formed by the reservoir plate and storing ink; a nozzle plate formed under the reservoir plate; a nozzle formed in the nozzle plate for injecting ink to record information; a first piezoelectric element formed on the substrate in a first area which is arranged above the space part and actuated when voltage is applied thereto; a second piezoelectric element formed on the substrate in a second area which is not arranged above the space part and not actuated even when voltage is applied thereto; and an upper electrode formed on the first piezoelectric element; whereby rigidity of an entire structure is elevated and panel vibration is reduced, by the second piezoelectric element.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION

Figure 1:
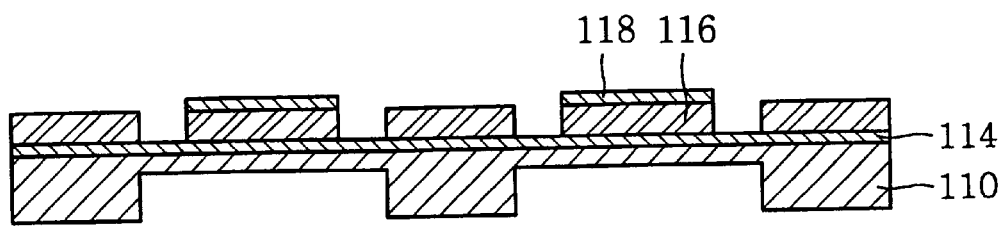
FIG. 1 is a cross-sectional view illustrating an example of a micro actuator according to the related art.
Figure 2:
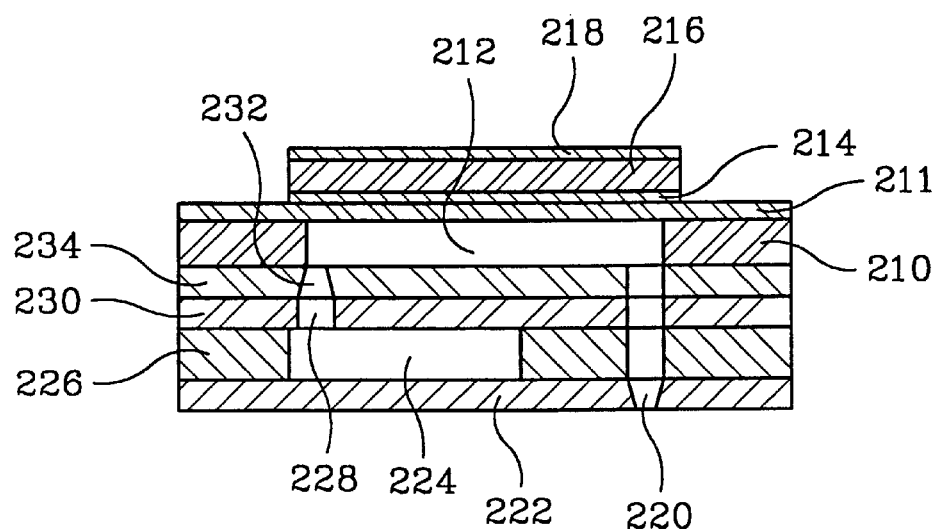
FIG. 2 is a cross-sectional view illustrating an example of an ink jet printer head according to the related art.

Hereinafter, the present invention will be described in detail.

In the present invention, it is preferred that a thin metal plate or a thin ceramic plate is used as a substrate of a micro actuator.

It is preferred that a thin stainless steel plate containing among its constituents chrome (Cr) of no less than 10% and iron (Fe) of no less than 70%, or a thin metal plate containing nickel (Ni), chrome (Cr) and titanium (Ti) a content sum of which is no less than 90% of an entire composition, is used as the thin metal plate.

Further, it is preferred that a thin metal plate having a thickness of 3–200 µm is used as the substrate.

The thin metal plate can be formed with a space part on a desired portion thereof by wet-etching, pressing or electroforming. At this time, the space part is formed on a lower surface of the substrate such that it is opened only at its lower end.

While various materials can be used as the thin ceramic plate, it is preferred that the thin ceramic plate contains typically zirconium oxide ($ZrO_2$), aluminum oxide ($Al_2O_3$) and silicon dioxide ($SiO_2$), a content sum of which is no less than 80% of an entire composition.

The thin ceramic plate used as the substrate is manufactured by making slurry containing the above described oxide powder into the form of a green sheet and sintering the green sheet. Alternatively, the thin ceramic plate used as the substrate is manufactured by shaping the slurry containing the above described oxide powder to have a desired substrate configuration, such as defining a space part, etc. therein, and thereafter by sintering the slurry.

It is preferred that the thin ceramic plate used as the substrate has a thickness of 5–300 μm.

In the case that a thin metal plate is used as the substrate, since the thin metal plate has conductivity by itself, it is not necessary to form a separate lower electrode.

However, in the case that a thin ceramic plate is used as the substrate, since the thin ceramic plate does not have any conductivity by itself, a lower electrode is formed on the thin ceramic plate.

Platinum (Pt), silver (Ag), alloy of silver and palladium (Ag/Pd), nickel (Ni), or copper (Cu) is selectively used to make the lower electrode, and at this time, it is preferred that the lower electrode has a thickness of no greater than 20μm.

Ceramic is used as material for forming a piezoelectric element, and typical examples of the ceramic used for forming the piezoelectric element include $PZT[Pb(Zr_{1/2}Ti_{1/2})O_3]$, $PLZT[Pb_{1-x}La_x(Zr_{1/2}Ti½)O_3]$, $BaTiO_3$ and $PbTiO_3$, etc.

The PZT, PLZT, $BaTiO_3$ and $PbTiO_3$ have a purity of no less than 95%, and it is preferred that a ratio between zirconium and titanium (Zr/Ti) among constituents of the ceramic is within a range of 4:6–6:4. However, in the case of PLZT, it is preferred that the ceramic contains lanthanum (La) of less than 5% among its constituents.

Moreover, a small amount of strontium (Sr), manganese (Mn), niobium (Nb), etc. can be added to the ceramic, and at this time, it is preferred that a content sum of these elements is less than 5% of an entire composition.

A piezoelectric element which has a shape of a thick film, is formed using the ceramic. At this time, it is preferred that the piezoelectric element is formed to have a configuration of a plate which has a thickness of 5–300 μm.

The manufactured piezoelectric element is attached to the metal substrate or to the ceramic substrate on which the lower electrode is formed. At this time, in order to enable the piezoelectric element to exhibit excellent actuating performance, the piezoelectric element must be firmly attached to the substrate.

Among various conventional methods for attaching the piezoelectric element to the substrate, it is typical to employ a method using adhesive or a metalizing process.

In the case that adhesive is used for attaching the piezoelectric element to the substrate, after applying adhesive in the form of paste onto the substrate or onto the piezoelectric element by a screen printing technique, etc., the piezoelectric element is attached to the substrate.

At this time, the adhesive can be applied onto an entire surface of the substrate or partially applied onto a necessary portion of the substrate or the piezoelectric element.

If the adhesive is applied onto the entire surface of the substrate, the adhesive which is applied onto the entire surface of the substrate can serve as a protective film which protects the substrate when the piezoelectric element is etched using acid.

Also, in the case that the adhesive is applied onto the entire surface of the conductive substrate, the conductive substrate can be used as a common lower electrode for respective actuators.

The metalizing process which is another method used for attaching the piezoelectric element to the substrate, is a process in which metal is applied onto one surface of the piezoelectric element, and the surface of the piezoelectric element and another metal plate are brazed to each other using a third material as a medium.

When the metalizing process is used as a method for attaching the piezoelectric element to the substrate, it is possible to secure the piezoelectric element to the substrate more firmly when compared to the case that the adhesive is used, whereby compliance of the actuator can be reduced to improve actuating property.

After the piezoelectric element is attached to the substrate, the piezoelectric element is patterned to a pattern which is to be etched. Thereafter, the piezoelectric element is etched.

At this time, as a method for patterning the piezoelectric element, a process in which the piezoelectric element is masked by using a shadow mask, a process in which a photoresist is applied on the piezoelectric element and is patterned by photolithography, or the like, can be adopted.

When etching the piezoelectric element, in the present invention, an entire part of the piezoelectric element, which is not actuated when voltage is applied thereto, is not etched. Instead, in the present invention, the etching and patterning operations are performed such that only a boundary portion between a first piezoelectric element which is arranged above the space part and is actuated when voltage is applied thereto and a second piezoelectric element which is not arranged above the space part and is not actuated when voltage is applied thereto, is etched.

At this time, while a line width of the piezoelectric element which is removed can be variously adjusted, it is preferred that, when assuming that W is a width of the space part, T is a thickness of the piezoelectric element, D is a width of the first piezoelectric element which is left above the space part and d is a line width of a removed piezoelectric element, a relationship between the width D of the first piezoelectric element which is left above the space part and the line width d of the removed piezoelectric element is given as described below:

$$\tfrac{1}{5}T<d<5T$$

$$\tfrac{1}{3}W<D<W$$

Since a range in the line width d of the removed piezoelectric element is determined in view of easiness in manufacturing, it can be established as wide as possible, and since a range in the width D of the first piezoelectric element which is left above the space part is considered acute as being an active factor, it is preferred that it is established narrowly wherever possible.

Specifically, it is preferred that the width D of the first piezoelectric element which is left above the space part is 0.5–0.9 times the width W of the space part.

Further, it is possible to etch the first piezoelectric element which is left above the space part such that it is wholly divided into two parts in a vertical direction or such that only a portion thereof is divided into two parts in the vertical direction. If the first piezoelectric element which is left above the space part is divided into two parts as described above, the piezoelectric element can be vibrated in an easier manner when power is supplied thereto.

While the piezoelectric element is etched after it is patterned to a desired pattern, as a method for etching the piezoelectric element, both a wet etching technique and a dry etching technique can be employed.

In the wet etching technique, etching is implemented while the piezoelectric element is immersed in etching solution. As the etching solution for etching the piezoelectric element, etching solution containing hydrogen fluoride (HF) of no less than 0.3%, etching solution containing hydrogen chloride (HCl) of no less than 0.5%, etching solution containing fluorine nitric acid ($HNF_4$) of no less than 0.5%, etching solution containing nitric acid ($HNO_3$) of no less than 0.5%, and etching solution containing ammonium chloride ($NH_4Cl$) of no less than 0.5% are used.

In the case that the piezoelectric element is etched by using the wet etching technique, an etching surface is not vertical, but has an inclined contour due to a difference in etching rate which depends upon a crystal orientation, whereby a distance between two piezoelectric elements cannot but be lengthened.

In the meanwhile, in the dry etching technique, instead of etching solution, plasma, reaction gas containing fluorine, reaction gas containing chlorine, etc. are used for etching piezoelectric element. Etching processes in the dry etching technique are similar to etching processes in the wet etching technique.

When the piezoelectric element is etched using the dry etching technique, since a vertical etching surface is obtained, it is possible to shorten the distance between two piezoelectric elements and elevate integration density of nozzles. Accordingly, it is preferred that the dry etching technique is used, in view of the fact that a structure of a printer head can be compacted whereby the entire printer head can be miniaturized and printing resolution can be improved.

By performing etching operations as described above, not only the first piezoelectric element which is actuated when voltage is applied thereto, but also the second piezoelectric element which is not actuated even when voltage is applied thereto, is left on the substrate.

An upper electrode is formed on the piezoelectric element. This upper electrode can be formed by the fact that material therefor is applied on the entire surface of the piezoelectric element, etched together with the piezoelectric element and then patterned. Alternatively, the upper electrodes can be formed on the first piezoelectric elements among etched piezoelectric elements.

At this time, the upper electrode is generally made of silver (Ag), aluminum (Al), gold (Au), platinum (Pt), etc.

As described above, in the case that a portion rather than an entire part of the piezoelectric element which is unnecessary is etched, etching time is shortened, and a self-restriction phenomenon in which an etching reaction is ceased when the etching is progressed to a predetermined depth, takes place.

Figure 11:
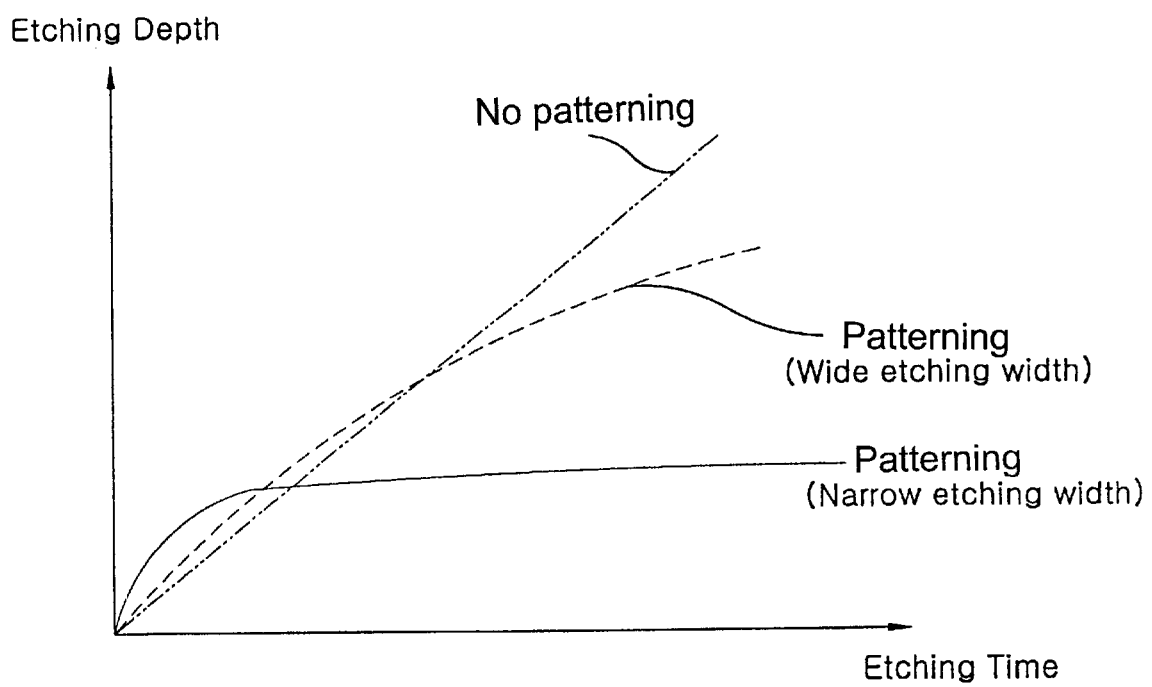
FIG. 11 is a graph illustrating a relationship between an etching time and an etching depth.

Referring to FIG. 11, there is shown a graph illustrating a relationship between an etching time and an etching depth, in the cases that patterning is not performed, patterning is performed to have a wide etching width and patterning is performed to have a narrow etching width as instructed in the present invention.

As can be readily seen from FIG. 11, in the case that patterning is not performed at all, the etching depth is increased in direct proportion to the etching time, and in the case that patterning is performed to have the wide etching width, the etching depth is increased as the etching time is lapsed even though the former is not directly proportional to the latter.

On the contrary, in the case that the piezoelectric element is etched to have the narrow etching width as instructed by the method of the present invention, etching is developed more rapidly at an initial stage when compared to the other two cases, and the etching reaction is ceased when the etching is progressed to a predetermined depth.

In the micro actuator of the present invention, constructed as mentioned above, since an amount of the piezoelectric element which is etched is decreased, degradation of etching solution is lessened thereby to accomplish economy, and since loading effect is reduced, repeatability of the processing and uniformity of etching are ameliorated.

Also, by the fact that a width of a boundary portion which is to be etched can be adjusted, since a self-restriction phenomenon in which an etching reaction is ceased when the etching is progressed to a predetermined depth can be achieved, it is possible to prevent the etching solution used for etching the piezoelectric element from affecting the substrate, and repeatability of the precessing is improved.

In addition, the second piezoelectric element which is left above the substrate increases rigidity of the entire structure, thereby to reduce vibration and to suppress crosstalk between respective chambers.

Besides, by the fact that the first piezoelectric element which is used in driving a cell is divided in the vertical direction, since a vibrating plate can be easily bent when the first piezoelectric element is vibrated, an amount of energy which is consumed upon vibrating is diminished.

While the micro actuator manufactured by the method described above can be used to manufacture various articles, as an example, an ink jet printer head which is manufactured using the micro actuator will be described hereinafter.

An ink jet printer head manufactured using the aforementioned micro actuator of the present invention comprises a substrate having a space part which is integrally defined in the substrate and is opened only at a lower end thereof; a nozzle plate formed under the substrate; a nozzle formed in the nozzle plate for injecting ink to record information; a chamber formed by the space part of the substrate and the nozzle plate and containing ink; a first piezoelectric element formed on the substrate in a first area which is arranged above the space part and actuated when voltage is applied thereto; a second piezoelectric element formed on the substrate in a second area which is not arranged above the space part and not actuated even when voltage is applied thereto; and an upper electrode formed on the first piezoelectric element. The ink jet printer head may further comprise a lower electrode arranged between the substrate and the first and second piezoelectric elements.

In the ink jet printer head constructed as mentioned above, ink is stored in the chamber. If voltage is applied to the micro actuator which is formed on the substrate, to actuate the micro actuator, as volume of the chamber is momentarily reduced, ink stored in the chamber is injected through the nozzle. After the ink is injected, ink is supplied again to the chamber to repeat the above injecting procedure.

Moreover, the ink jet printer head may further comprise, between the substrate and the nozzle plate, a restrictor plate in which a restrictor is formed, a fluid passage plate in which a fluid passage is formed and a reservoir plate in which a reservoir is formed.

An ink jet printer head further including the above described components comprises a substrate having a space part which is integrally defined in the substrate and is opened only at a lower end thereof; a restrictor plate formed under the substrate; a chamber formed by the space part of the substrate and the restrictor plate; a restrictor formed by the restrictor plate for keeping velocity of ink flowing into the chamber constant; a fluid passage plate formed under the restrictor plate; a fluid passage formed by the fluid passage plate for defining an ink flowing path; a reservoir plate formed under the fluid passage plate; a reservoir formed by the reservoir plate and storing ink; a nozzle plate formed under the reservoir plate; a nozzle formed in the nozzle plate for injecting ink to record information; a first piezoelectric element formed on the substrate in a first area which is arranged above the space part and actuated when voltage is applied thereto; a second piezoelectric element formed on the substrate in a second area which is not arranged above the space part and not actuated even when voltage is applied thereto; and an upper electrode formed on the first piezoelectric element. Also, in this case, the ink jet printer head may further comprise a lower electrode arranged between the substrate and the first and second piezoelectric elements.

By the construction described above, ink moving paths such as the reservoir, the fluid passage and the restrictor, which have different sizes and configurations, are additionally defined in the ink jet printer head.

In the ink jet printer head constructed as mentioned above, ink supplied from an ink container is stored in the reservoir and is supplied to the chamber through the fluid passage. At this time, the restrictor formed between the fluid passage and the chamber serves to keep velocity of ink flowing into the chamber constant.

If voltage is applied to the micro actuator which is formed on the substrate, the micro actuator is actuated, and by this actuation of the micro actuator, as volume of the chamber is momentarily reduced, ink stored in the chamber is injected through the nozzle. After the ink is injected, ink is supplied again to the chamber.

Due to the fact that the ink jet printer head uses the micro actuator manufactured as described above, the same effects as accomplished by the micro actuator can also be obtained in the ink jet printer head.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
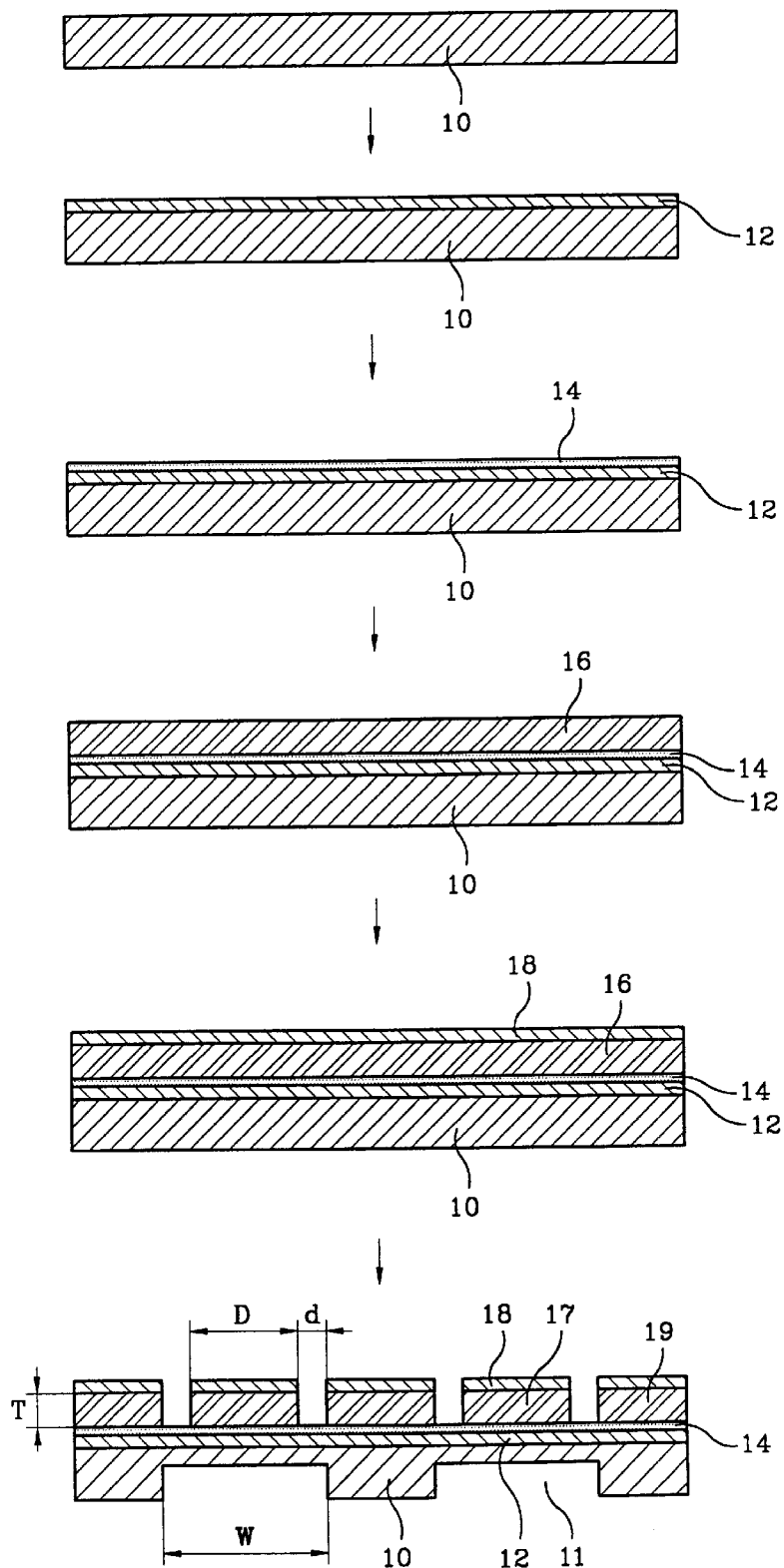
FIG. 3 is a flow diagram for explaining a method for manufacturing a micro actuator, in accordance with an embodiment of the present invention.

FIG. 3 is a flow diagram for explaining a method for manufacturing a micro actuator, in accordance with an embodiment of the present invention.

A substrate 10 is made of silicon. The substrate 10 is formed with a space part 11, a lower electrode 12 is formed on the silicon substrate 10, and an adhesive layer 14 is applied on the lower electrode 12.

A piezoelectric element 16 which is separately formed and has a shape of a thick film, is bonded onto the adhesive layer 14, and an upper electrode 18 is formed wholly on the bonded piezoelectric element 16.

The piezoelectric element 16 on which the upper electrode 18 is formed, is patterned by a photoresist and is etched by using a dry etching technique. At this time, by the fact that the piezoelectric element 16 is etched only in a first area which is arranged above the space part 11 such that a first piezoelectric element 17 is left in the first area, a second piezoelectric element 19 which is not used in driving a cell, is also left in a second area which is not arranged above the space part 11, such that it is symmetrized with a portion of the substrate 10 which constitutes a chamber plate of a lower structure thereby to enhance rigidity of an overall structure.

Figure 4:
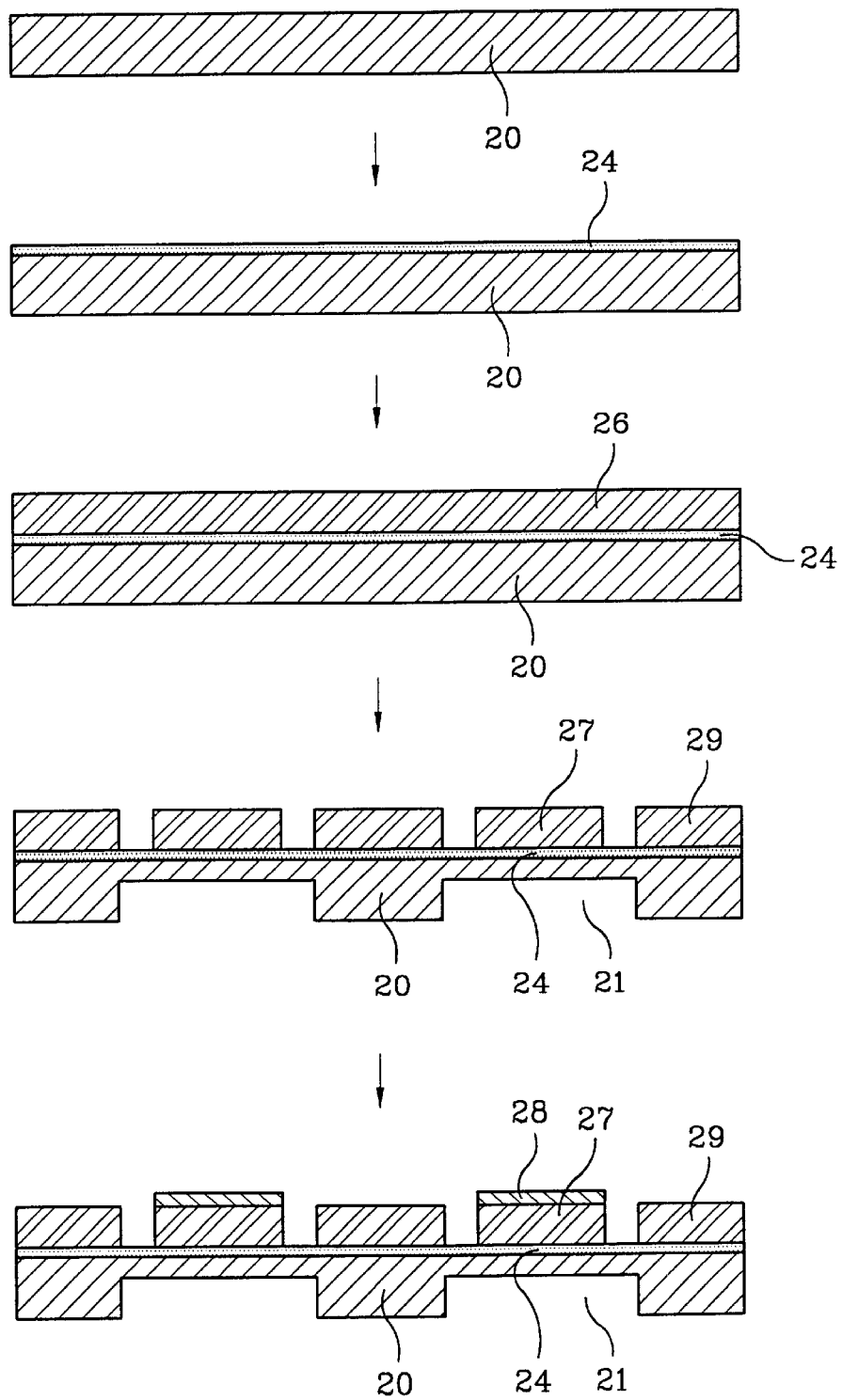
FIG. 4 is a flow diagram for explaining a method for manufacturing a micro actuator, in accordance with another embodiment of the present invention.

FIG. 4 is a flow diagram for explaining a method for manufacturing a micro actuator, in accordance with another embodiment of the present invention.

A substrate 20 is made of a thin metal plate. The metal substrate 20 is formed with a space part 21, and since the metal substrate 20 has conductivity by itself, an adhesive layer 24 is directly applied on the metal substrate 20.

A piezoelectric element 26 which is separately formed and has a shape of a thick film, is bonded onto the adhesive layer 24, and the bonded piezoelectric element 26 is patterned by using a photoresist, to a pattern which is desired to be etched. Of course, at this time, the piezoelectric element 26 is patterned such that it is etched only in a first area which is arranged above the space part 21.

The patterned piezoelectric element 26 is etched by using a dry etching technique. By this, in addition to a first piezoelectric element 27 which is left in the first area, a second piezoelectric element 29 which is not used in driving a cell, is also left in a second area which is not arranged above the space part 21, such that it is symmetrized with a portion of the substrate 20 which constitutes a chamber plate of a lower structure thereby to enhance rigidity of an overall structure.

The etched piezoelectric element 26 is patterned such that an upper electrode is formed only on the first piezoelectric element 27 which is used in driving a cell, and then, an upper electrode 28 is formed on the first piezoelectric element 27.

In the micro actuator manufactured by using this method, since the piezoelectric element is etched only in the first area which is arranged above the space part, rigidity of an overall structure is enhanced, and since the micro actuator is manufactured using the dry etching technique, integration density of nozzles is elevated.

Figure 5:
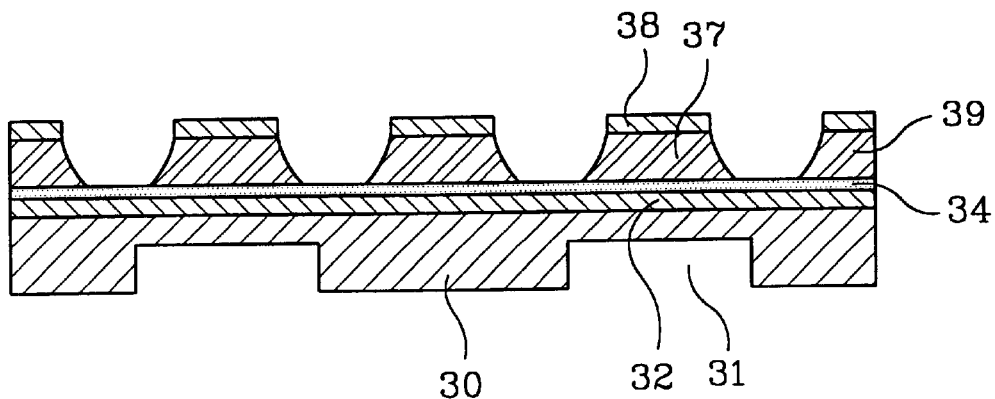
FIG. 5 is a cross-sectional view illustrating a micro actuator in accordance with another embodiment of the present invention.

FIG. 5 is a cross-sectional view illustrating a micro actuator in accordance with another embodiment of the present invention.

A micro actuator in accordance with this embodiment includes a silicon substrate 30 which is formed with a space part 31, a lower electrode 32 which is formed on the substrate 30, a first piezoelectric element 37 and a second piezoelectric element 39 which are formed on the lower electrode 32 by a wet etching technique, and an upper electrode 38 which is formed on the first and second piezoelectric elements 37 and 39.

Of course, at this time, a piezoelectric element is patterned such that the second piezoelectric element 39 is left above a chamber wall.

Figure 6:
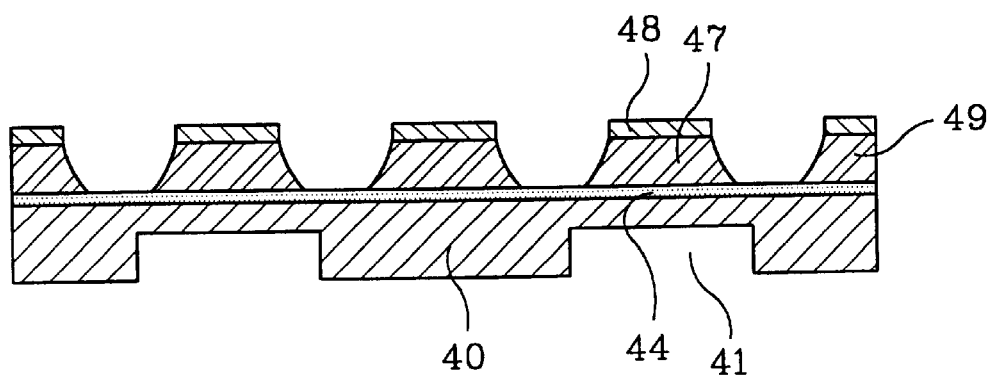
FIG. 6 is a cross-sectional view illustrating a micro actuator in accordance with another embodiment of the present invention.

FIG. 6 is a cross-sectional view illustrating a micro actuator in accordance with another embodiment of the present invention.

A micro actuator in accordance with this embodiment includes a metal substrate 40 which is formed with a space part 41, a first piezoelectric element 47 and a second piezoelectric element 49 which are formed on the substrate 40 by a wet etching technique, and an upper electrode 48 which is formed on the first and second piezoelectric elements 47 and 49.

Of course, at this time, a piezoelectric element is patterned such that the second piezoelectric element 49 is left above a chamber wall.

Figure 7:
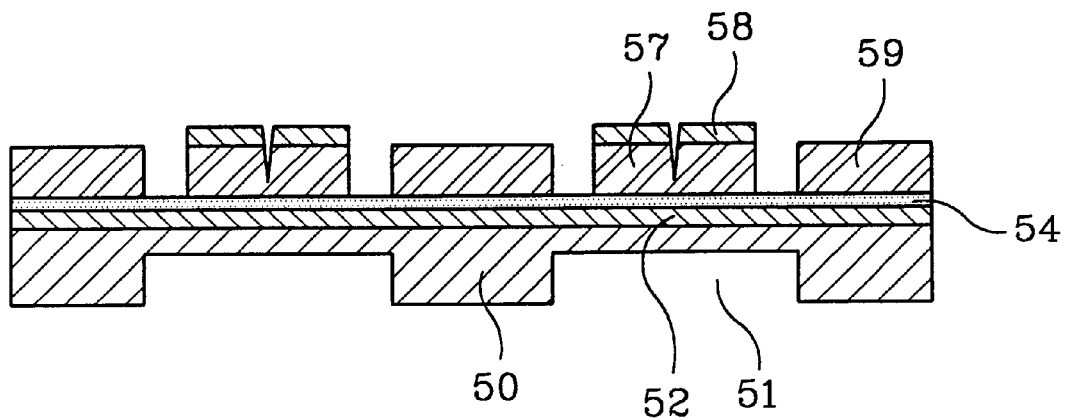
FIG. 7 is a cross-sectional view illustrating a micro actuator in accordance with still another embodiment of the present invention.

FIG. 7 is a cross-sectional view illustrating a micro actuator in accordance with still another embodiment of the present invention.

In a micro actuator shown in FIG. 7, a piezoelectric element is patterned such that a second piezoelectric element 59 is left above a portion of a substrate 50 which serves as a chamber plate, and a first piezoelectric element 57 which is arranged above a space part 51 and used in driving a cell, is divided into two parts in a vertical direction by etching an upper portion thereof. At this time, it is to be noted that the first piezoelectric element 57, which is formed on an adhesive layer 54 is not wholly divided into two parts in the vertical direction, but only the upper portion thereof is divided into two parts. A lower electrode 52 is formed on the substrate 50 and an upper electrode 58 is formed on the piezoelectric element 57.

Figure 8:
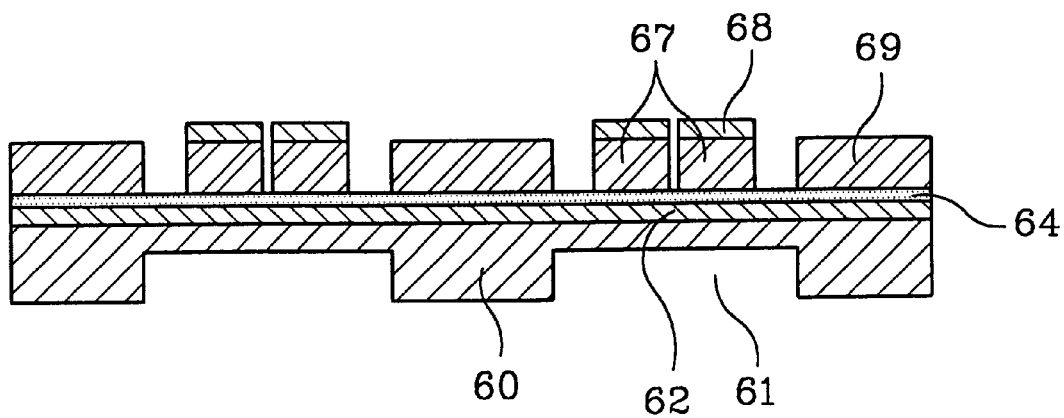
FIG. 8 is a cross-sectional view illustrating a micro actuator in accordance with yet still another embodiment of the present invention.

FIG. 8 is a cross-sectional view illustrating a micro actuator in accordance with yet still another embodiment of the present invention.

In a micro actuator shown in FIG. 8, a piezoelectric element is patterned such that a second piezoelectric element 69 is left above of a substrate 60 which serves as a chamber plate, and a first piezoelectric element 67 which is arranged above a space part 61 and used in driving a cell, is divided into two parts in a vertical direction by etching the first piezoelectric element 67, which is formed on an adhesive layer 64 as a whole from top to bottom. A lower electrode 62 is formed on the substrate and an upper electrode 68 is formed on the piezoelectric element 67.

Figure 9:
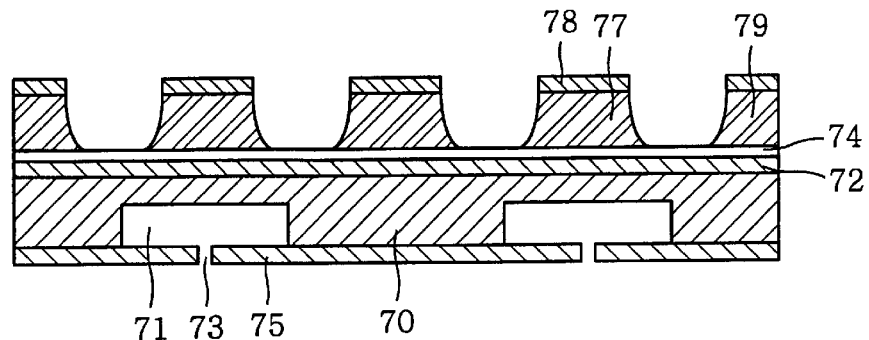
FIG. 9 is a cross-sectional view illustrating an embodiment of an ink jet printer head manufactured using a micro actuator of the present invention.

FIG. 9 is a cross-sectional view illustrating an embodiment of an ink jet printer head manufactured using a micro actuator of the present invention.

An ink jet printer head of this embodiment includes a substrate 70 which is formed with a space part, a nozzle plate 75 which is formed below the substrate 70, a chamber 71 which is defined by the space part of the substrate 70 and the nozzle plate 75, a nozzle 73 which is formed in the nozzle plate 75, a lower electrode 72 which is formed on the substrate 70, a first piezoelectric element 77 and a second piezoelectric element 79 which are formed on the lower electrode 72, and an upper electrode which is formed on the first and second piezoelectric element 77 and 79.

Of course, at this time, only a portion of a piezoelectric element which is arranged above the space part and is not actuated when current is applied thereto, is removed thereby to enhance rigidity of an overall structure.

Figure 10:
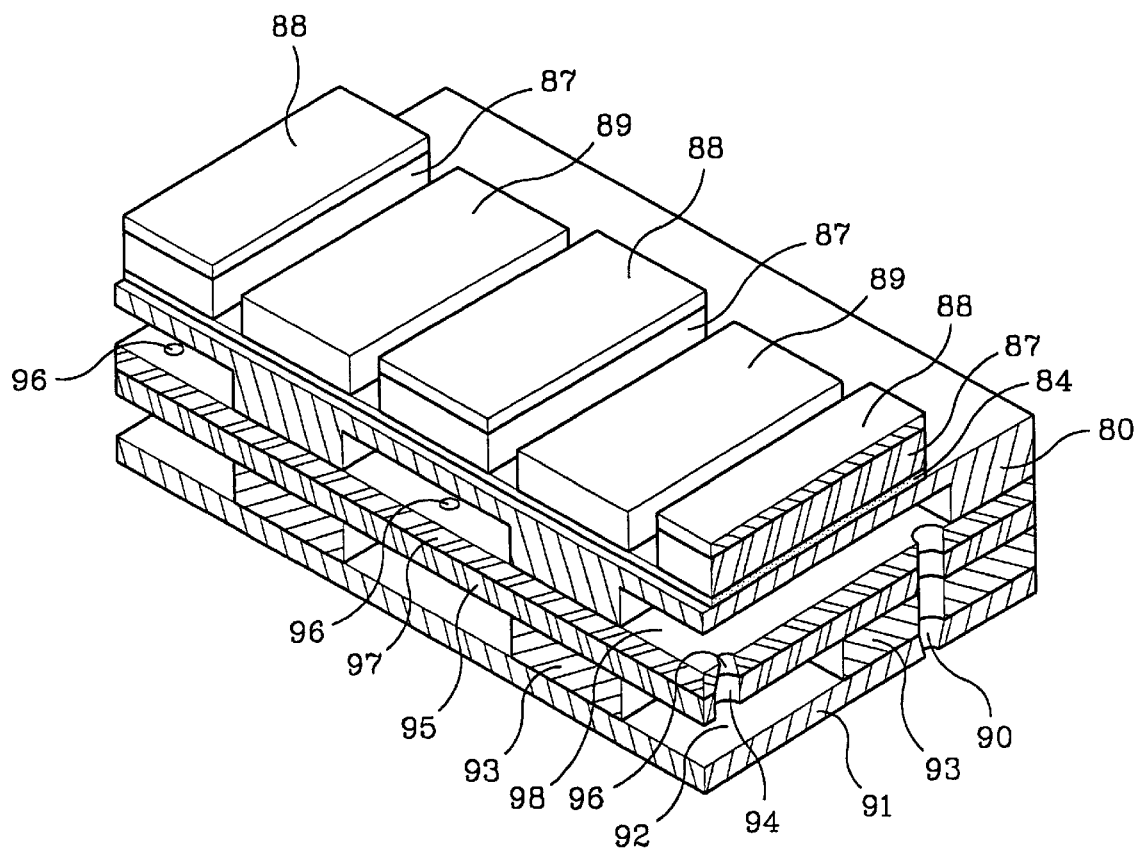
FIG. 10 is a cross-sectional view illustrating another embodiment of an ink jet printer head manufactured using a micro actuator of the present invention.

FIG. 10 is a cross-sectional view illustrating another embodiment of an ink jet printer head manufactured using a micro actuator of the present invention.

An ink jet printer head shown in FIG. 10 includes a substrate 80 which is formed with a space part, a restrictor plate 97 which is formed below the substrate 80, a restrictor 96 which is formed in the restrictor plate 97, a fluid passage plate 95 which is formed below the restrictor plate 97, a fluid passage 94 which is formed in the fluid passage plate 95, a reservoir plate 93 which is formed below the fluid passage plate 95, a reservoir 92 which is formed by the reservoir plate 93, a nozzle plate 91 which is formed below the reservoir plate 93, a nozzle 90 which is formed in the nozzle plate 91, a chamber 98 which is defined by the substrate 80 and the restrictor plate 97, a first piezoelectric element 87 and a second piezoelectric element 89 which are formed on the substrate 80, and an upper electrode 88 which is formed on the first piezoelectric elements 87. The piezoelectric elements 87 and 89 are formed on an adhesive layer 84.

Of course, at this time, since only a portion of a piezoelectric element which is arranged above the space part and is not actuated when current is applied thereto, is removed, enhanced rigidity of an overall structure is maintained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A micro actuator comprising:
   a substrate having a space part which is integrally defined in the substrate and is opened only at a lower end thereof;
   a first piezoelectric element formed on the substrate in a first area which is arranged above the space part and actuated when voltage is applied thereto;
   a second piezoelectric element formed on the substrate in a second area which is not arranged above the space part and not actuated; and
   an upper electrode formed on the first piezoelectric element;
   whereby rigidity of an entire structure is elevated and panel vibration is reduced, by the second piezoelectric element;
   wherein, when assuming that W is a width of the space part which is defined in the substrate, T is a thickness of the first and second piezoelectric elements, D is a width of the first piezoelectric element and d is a line width of a removed piezoelectric element, a relationship between the width D of the first piezoelectric element and the line width d of the removed piezoelectric element is given as described below:

$$1/5 T < d < 5T$$

$$1/3 W < D < W.$$

2. A micro actuator as claimed in claim 1, further comprising:
   a lower electrode disposed between the substrate and the first and second piezoelectric elements.

3. A micro actuator as claimed in claim 2, wherein the lower electrode has a thickness which is no greater than 20 μm.

4. A micro actuator as claimed in claim 2, wherein the first piezoelectric element is divided into two parts in a vertical direction.

5. A micro actuator as claimed in claim 4, wherein a portion of the first piezoelectric element is divided into two parts in a vertical direction.

6. A micro actuator as claimed in claim 1, wherein the substrate is made of ceramic or metal.

7. A micro actuator as claimed in claim 6, wherein the substrate made of ceramic has a thickness of 5–300 μm.

8. A micro actuator as claimed in claim 6, wherein the substrate made of metal has a thickness of 3–200 μm.

9. A micro actuator as claimed in claim 1, wherein the first and second piezoelectric elements have a thickness of 5–300 μm.

10. A micro actuator as claimed in claim 1, wherein the width D of the first piezoelectric element is 0.5–0.9 times the width W of the space part.

11. A micro actuator as claimed in claim 1, wherein the first piezoelectric element is divided into two parts in a vertical direction.

12. A micro actuator as claimed in claim 11, wherein a portion of the first piezoelectric element is divided into two parts in a vertical direction.

13. An ink jet printer head comprising:
   a substrate having a space part which is integrally defined in the substrate and is opened only at a lower end thereof;
   a nozzle plate formed under the substrate;
   a nozzle formed in the nozzle plate for injecting ink to record information;
   a chamber formed by the space part and the nozzle plate and containing ink;
   a first piezoelectric element formed on the substrate in a first area which is arranged above the space part and actuated when voltage is applied thereto;

a second piezoelectric element formed on the substrate in a second area which is not arranged above the space part and not actuated; and an upper electrode formed on the first piezoelectric element;

whereby rigidity of an entire structure is elevated and panel vibration is reduced, by the second piezoelectric element;

wherein, when assuming that W is a width of the space part, T is a thickness of the first and second piezoelectric elements, D is a width of the first piezoelectric element and d is a line width of a removed piezoelectric element, a relationship between the width D of the first piezoelectric element and the line width d of the removed piezoelectric element is given as described below:

$$\tfrac{1}{5}T<d<5T$$

$$\tfrac{1}{3}W<D<W.$$

14. An ink jet printer head as claimed in claim 13, further comprising:
a lower electrode disposed between the substrate and the first and second piezoelectric elements.

15. An ink jet printer head as claimed in claim 14, wherein the lower electrode has a thickness which is no greater than 20 μm.

16. An ink jet printer head as claimed in claim 14, wherein the first piezoelectric element is divided into two parts in a vertical direction.

17. An ink jet printer head as claimed in claim 16, wherein a portion of the first piezoelectric element is divided into two parts in a vertical direction.

18. An ink jet printer head as claimed in claim 13, wherein the substrate is made of ceramic or metal.

19. An ink jet printer head as claimed in claim 18, wherein the substrate made of ceramic has a thickness of 5–300 μm.

20. An ink jet printer head as claimed in claim 18, wherein the substrate made of metal has a thickness of 3–200 μm.

21. An ink jet printer head as claimed in claim 13, wherein the first and second piezoelectric elements have a thickness of 5–300 μm.

22. An ink jet printer head as claimed in claim 13, wherein the width D of the first piezoelectric element is 0.5–0.9 times the width W of the space part.

23. An ink jet printer head as claimed in claim 13, wherein the first piezoelectric element is divided into two parts in a vertical direction.

24. An ink jet printer head as claimed in claim 23, wherein a portion of the first piezoelectric element is divided into two parts in a vertical direction.

* * * * *

UNITED STATES PATENT AND TRADEMARK OFFICE
CERTIFICATE OF CORRECTION

PATENT NO.     : 6,530,652 B1
DATED          : March 11, 2003
INVENTOR(S)    : Il Kim and Young Jin Cho It is certified that error appears in the above-identified patent and that said Letters Patent is hereby corrected as shown below:

<u>Title page,</u>
Item [56], References Cited, FOREIGN PATENT DOCUMENTS, change "58-190861" to -- 59-190861 --.

Signed and Sealed this

Second Day of September, 2003

JAMES E. ROGAN
*Director of the United States Patent and Trademark Office*